US012660115B2

(12) United States Patent
Tseng et al.

(10) Patent No.: US 12,660,115 B2
(45) Date of Patent: Jun. 16, 2026

(54) LOCKING DEVICE AND LOCKING STRUCTURE USING SAME

(71) Applicant: HANWIT PRECISION INDUSTRIES LTD., New Taipei City (TW)

(72) Inventors: Ying-Chih Tseng, New Taipei City (TW); Ming-De Wu, New Taipei City (TW); Chih-Yuan Chen, New Taipei City (TW)

(73) Assignee: HANWIT PRECISION INDUSTRIES LTD., New Taipei City (TW)

( * ) Notice: Subject to any disclaimer, the term of this patent is extended or adjusted under 35 U.S.C. 154(b) by 162 days.

(21) Appl. No.: 18/599,614

(22) Filed: Mar. 8, 2024

(65) Prior Publication Data

US 2025/0287521 A1 Sep. 11, 2025

(51) Int. Cl.
H05K 7/14 (2006.01)

(52) U.S. Cl.
CPC ......... H05K 7/1417 (2013.01); H05K 7/1489 (2013.01)

(58) Field of Classification Search
CPC ........ H05K 5/023; H05K 7/18; H05K 5/0221; H05K 5/0217; H01F 7/124; F21V 17/18; E05C 5/00; E05C 1/10; E05C 3/14; E05C 2005/005; E05C 19/10; E05C 1/14; Y10S 81/09; G11B 33/123; F16B 7/22; G06F 1/181; G06F 1/183; E05B 3/00; E05B 55/00; E05B 13/10; E05B 65/46; A47B 88/407; A47B 88/43; A47B 46/005; A47B 57/50; A47F 5/0025; A47F 5/0037
See application file for complete search history.

(56) References Cited

U.S. PATENT DOCUMENTS

| | | | | | |
|---|---|---|---|---|---|
| 10,759,039 | B2 * | 9/2020 | Wu | .......................... | H05K 5/023 |
| 11,659,680 | B2 * | 5/2023 | Lu | .......................... | H05K 7/1489 |
| | | | | | 361/679.02 |
| 2013/0241378 | A1 * | 9/2013 | Zhang | .................. | H05K 5/0221 |
| | | | | | 403/327 |
| 2016/0150659 | A1 * | 5/2016 | Chen | ...................... | E05B 65/46 |
| | | | | | 292/126 |
| 2016/0353598 | A1 * | 12/2016 | Chen | ..................... | G11B 33/142 |
| 2021/0355707 | A1 * | 11/2021 | Wang | .................... | E05C 19/022 |
| 2024/0081017 | A1 * | 3/2024 | Tseng | ................... | H05K 7/1488 |

* cited by examiner

*Primary Examiner* — Sagar Shrestha
*Assistant Examiner* — Peter Krim
(74) *Attorney, Agent, or Firm* — MUNCY, GEISSLER, OLDS & LOWE, P.C.

(57) ABSTRACT

A locking device includes a casing composed of a cover and a back plate with a storage chamber and an accommodation groove defined in the cover, a pressing adjustment member set in the accommodation groove with the hook portion thereof inserted through a passage in the accommodation groove and stopped against the cover, a pivot mounted between the cover and the back plate, and a swivel hook and a rotating reset member both sleeved onto the pivot. The swivel hook has a hook end extending out of the casing and rotatably locked in a chassis. The hook portion of the pressing adjustment member adjusts the tightness of the cover, the swivel hook and the back plate according to whether the hook portion of the pressing adjustment member resists the inner wall of the chassis.

19 Claims, 12 Drawing Sheets

LOCKING DEVICE AND LOCKING STRUCTURE USING SAME

BACKGROUND OF THE INVENTION

1. Field of the Invention

The present invention provides a locking structure, in particular, two locking devices are respectively locked to two side plates of a movable frame, and the movable frame is located on both sides of a tray and can rotate, and the tray is stored in a server within the chassis. When the movable frame is stored on both sides of the tray, the inner wall of the chassis presses against the hook portion of the pressing adjustment member on the surface of the cover of the respective locking device. The hook portion is extruded and deformed, causing the two fixed portions of the pressing adjustment member to break away from an accommodation groove outward and press against the swivel hook of the respective locking device, so that the two sides of the swivel hook are pressed tightly by the cover and the back plate of the respective locking device without rotating. When the movable frame rotates from the tray to a predetermined angle, and the hook portion of the pressing adjustment member on the cover surface is not resisted by the inner wall of the chassis, the hook portion of the pressing adjustment member generates elastic reset and the two fixed portions are re-accommodated in the accommodation groove. The two sides of the swivel hook are not in a tight state with the cover and the back plate, causing rotation. The hook end of the swivel hook rotates downward and snaps into the positioning frames at the bottom of the chassis to form a fixed state. When the movable frame is opened to the maximum angle, the tray can be dragged outward to move a predetermined distance horizontally and the top side of the accommodating space is exposed, that is, the computer parts installed inside the tray can be repaired or replaced. After completion, the movable frame can be pushed back to both sides of the tray to form a mechanism with quick disassembly and assembly. Furthermore, the rotation pivots of the tray and the locking device are not on the same axis. This has the advantage of saving the space required for the rotating mechanism, and increasing the pivot distance between the force application point and the locking device to form a larger leverage ratio, making it easier to apply force.

2. Description of the Related Art

Under the current trend of network cloud technology and the Internet of things, the server technology of computers and industrial computers is growing at a rapid pace. Its development trend is mainly towards strong computing power, high speed and small size. Many electronic devices or equipment use computers to control their actions or perform functions, making computers play an extremely important role. When computers and industrial computer servers handle huge data operations, they urgently need high-density and large-scale memory storage devices (such as hard drives, solid-state drives, optical disc drives or recorders, etc.) to store and to read data, a large number of memory storage devices are generally placed inside computer hosts, server cases, storage or telecommunication cabinets, etc. to increase storage capacity.

Furthermore, since there are a large number of memory storage devices in general computer hosts, server hard drives, storage or telecommunications cases, and when users perform maintenance or replacement operations on each memory storage device, the replacement speed between the memory storage devices installed inside the hard drive must be easier and faster. The assembly structure and component manufacturing costs also need to be taken into consideration to meet the huge cost and demand for memory storage devices. When the hard drive is in operation for a long time, the stability of the overall system, the convenience of repair and replacement, and the convenience of user operation must be taken into consideration, thereby reducing the loss of downtime and manpower.

However, some of the memory storage devices currently in use are fixed in the hard drive using screw locking methods. The screws are passed through the holes in the rack, and then aligned and locked into the screw holes of the memory storage device. This screw locking method not only requires the use of a large number of screws, but also requires the removal and installation of multiple screws one by one before disassembly and installation. As a result, assembly takes a long time and the downtime for maintenance is significantly increased. If the hard drive is filled with interface cards, memory storage devices, power connections, cables and other components, it will be very inconvenient to insert tools to lock or unlock, and even cause the screws to become loose during the locking or unlocking process and become lost. Moreover, if the size of the screw is inappropriate and the force is applied to lock it, it will easily damage the screw hole on the memory storage device, which is not conducive to assembly or disassembly. In addition, server hard drives are widely used in computer rooms of telecommunications or storage systems and data centers. When a single memory storage device can be repaired and replaced more easily, the number of tens of thousands of memory storage devices installed on the servers in the computer room can be greatly increased, and the devices can be quickly disassembled and assembled for repair and replacement, which is an urgent research topic for relevant manufacturers engaged in this industry.

SUMMARY OF THE INVENTION

Therefore, in view of the above-mentioned problems and deficiencies, the inventor collected relevant information, and after many evaluations and considerations, he designed the invention of this locking device.

The main purpose of the present invention is to provide a locking device, including: a casing, a pressing adjustment member, a pivot, a swivel hook and a rotating reset member. The casing comprises a cover and a back plate fixed by a plurality of fasteners and corresponding lock holes on the cover. The cover comprises a storage chamber, a limit frame located at an edge of the storage chamber, a recessed accommodation groove provided in the storage chamber and a passage provided in the accommodation groove. The pressing adjustment member is set in the accommodation groove, comprising a hook portion inserted through the passage and stopped against and positioned on the surface of the cover. The pivot is disposed between the cover and the back plate. The swivel hook and the rotating reset member both are sleeved onto the pivot. The rotating reset member has two ends thereof respectively positioned in the swivel hook and the limit frame. The swivel hook comprises a hook end extending out of the casing and rotatably locked in a chassis of a server. The hook portion of the pressing adjustment member adjusts the tightness of the cover, the swivel hook and the back plate according to whether the hook portion of the pressing adjustment member resists the inner wall of the chassis. With the above composition, two locking devices are locked on the two side plates of the movable frame, and the movable frame is located on both sides of the tray and can rotate, and the tray is stored in the chassis of a server. When the movable frame is stored on both sides of the tray, the inner wall of the chassis presses against the hook portion on the surface of the cover. The hook portion is extruded and deformed, causing the two fixed portions of the pressing adjustment member to break away from the accommodation groove outward and press against the swivel hook, so that the two sides of the swivel hook are pressed tightly by the cover and the back plate without rotating. When the movable frame rotates from the tray to a predetermined angle, and the hook portion of the pressing adjustment member on the cover surface is not resisted by the inner wall of the chassis, the hook portion of the pressing adjustment member generates elastic reset and the two fixed portions are re-accommodated in the accommodation groove. The two sides of the swivel hook are not in a tight state with the cover and the back plate, causing rotation. The hook end of the swivel hook rotates downward and snaps into the positioning frames at the bottom of the chassis to form a fixed state. When the movable frame is opened to the maximum angle, the tray can be dragged outward to move a predetermined distance horizontally and the top side of the accommodating space is exposed, that is, the computer parts installed inside the tray can be repaired or replaced. After completion, the movable frame can be pushed back to both sides of the tray to form a mechanism with quick disassembly and assembly. Furthermore, the rotation pivots of the tray and the locking device are not on the same axis. This has the advantage of saving the space required for the rotating mechanism, and increasing the pivot distance between the force application point and the locking device to form a larger leverage ratio, making it easier to apply force.

Another object of the present invention is that the cover is formed with a first stopper and a second stopper on both sides of the bottom opening of the recessed storage chamber for the swivel hook to rotate to the first position and the second position dead center.

Still another object of the present invention is that a slope adjacent to the passage is formed on the surface of the cover where the hook portion of the pressing adjustment member is positioned, and a narrow positioning groove adjacent to the slope is formed.

Still another object of the present invention is that the pressing adjustment member is composed of a torsion spring, comprising two fixed portions respectively formed on two ends thereof and elastically resisting the wall surface of the accommodation groove. The two fixed portions are bent and extended toward opposite inner sides to form a hook portion in a hook shape.

Still another object of the present invention is that the rotating reset member is composed of a torsion spring, comprising an annular portion at the center that is placed around the pivot, a through hole defined in the annular portion, a fixed end extending from one end of the annular portion and inserted into a positioning hole on the swivel hook, and a movable end extending from an opposite end of the annular portion and resisting the limit frame.

Still another object of the present invention is that the swivel hook is composed of a plate member, comprising a wide plate body formed at the place where the pivot is inserted, a smoothly curved guide corner located on a top side of the wide plate body, the said hook end, which is narrow hook-shaped and extending from one side of the smoothly curved guide corner remote from the place through which the pivot is inserted, an inclined guide portion formed at the front side of the hook end, and a resisting edge formed on the hook end adjacent to the smoothly curved guide corner to resist the first stopper of the cover.

DETAILED DESCRIPTION OF THE INVENTION

Figure 1:
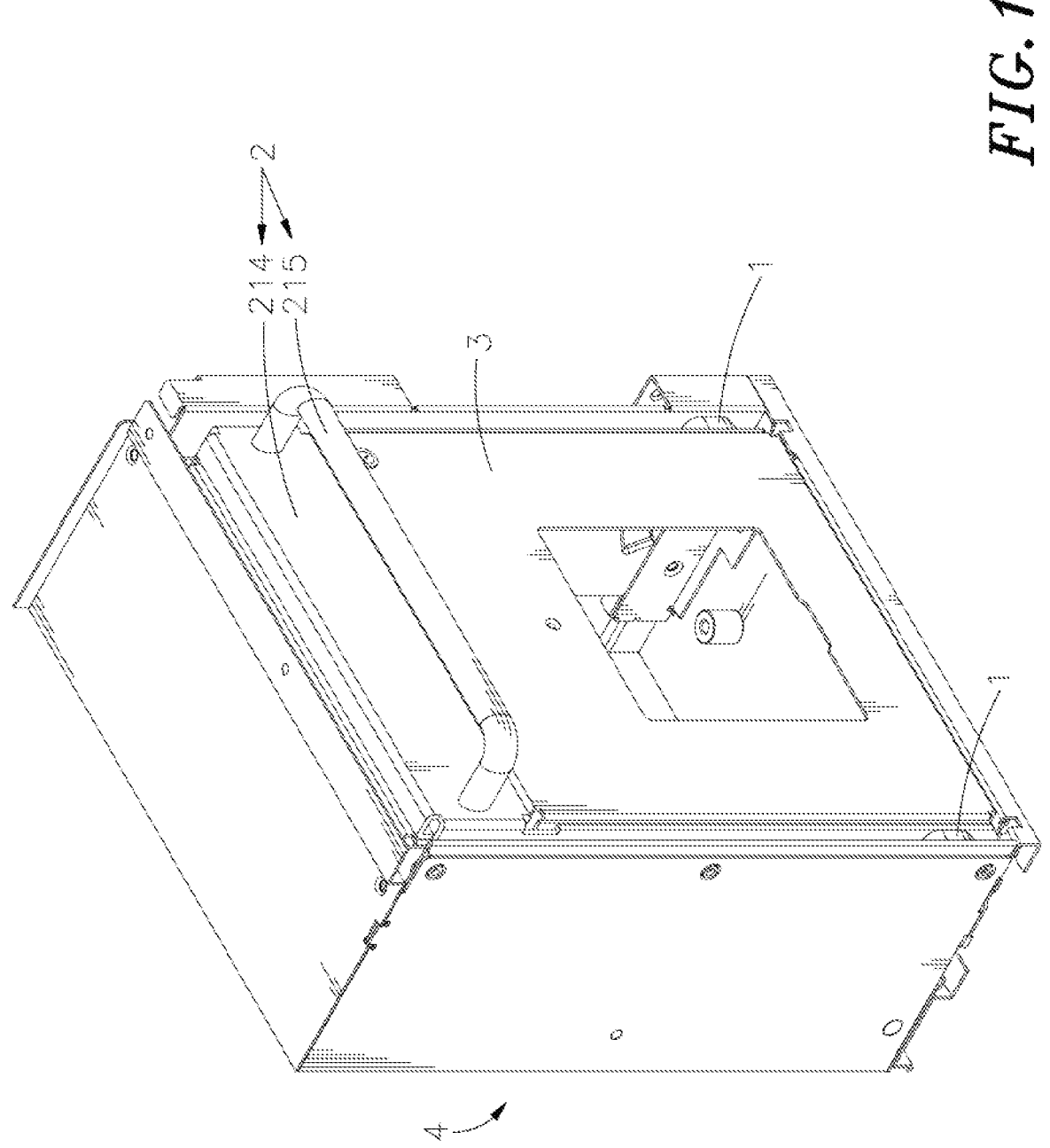
FIG. 1 is a three-dimensional appearance view of an embodiment of the locking structure of the present invention.
Figure 2:
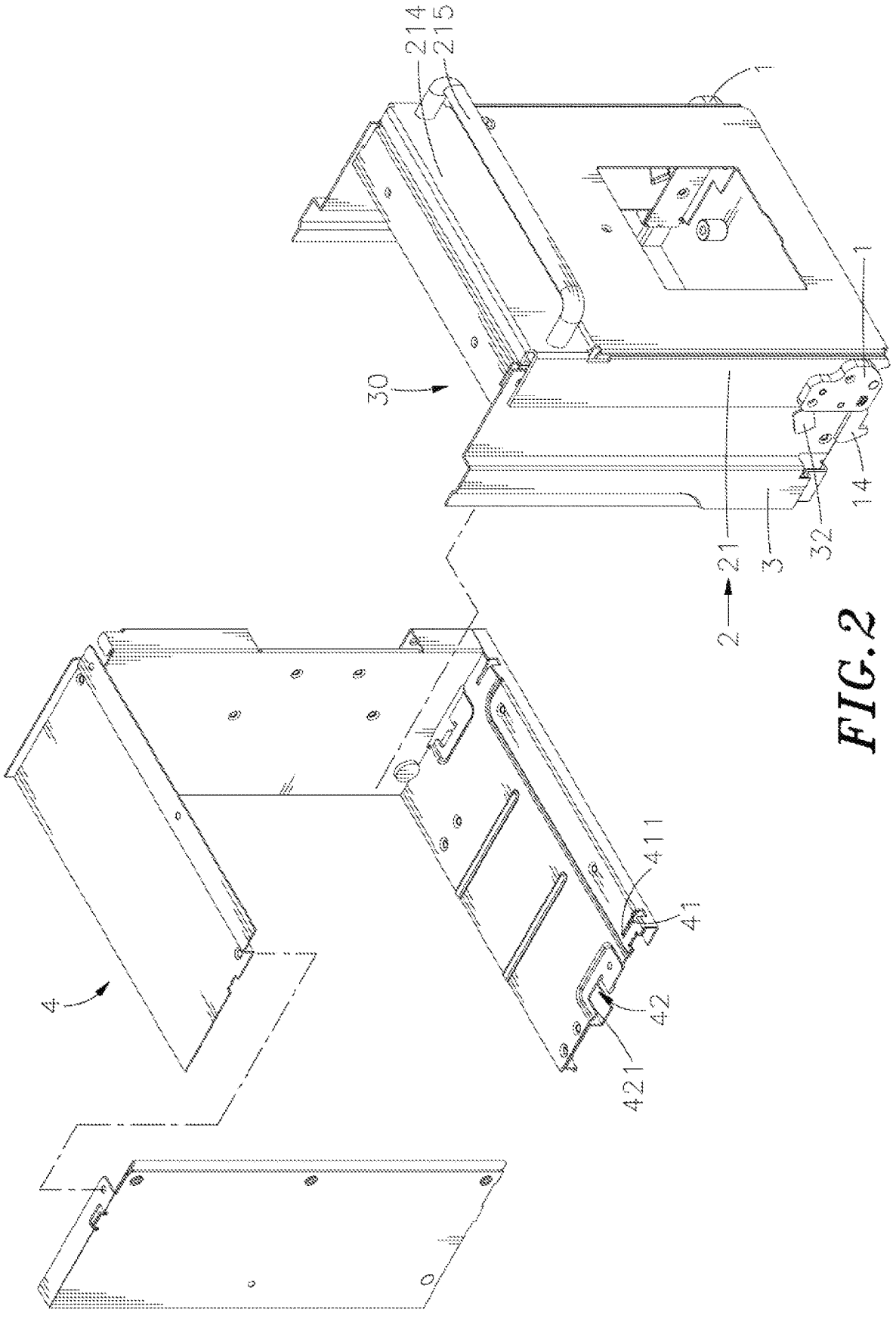
FIG. 2 is a three-dimensional partially exploded view of an embodiment of the locking structure of the present invention.
Figure 3:
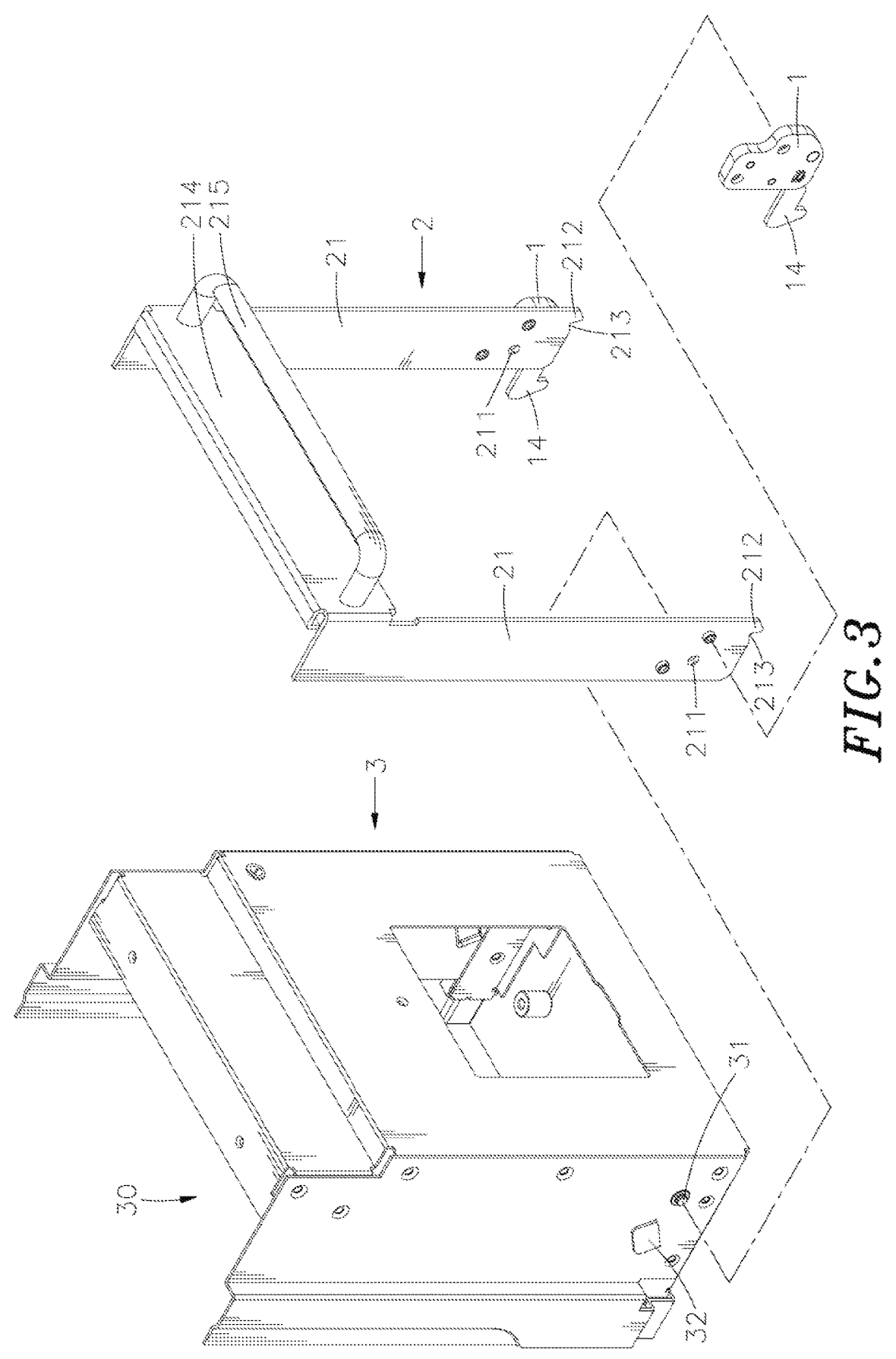
FIG. 3 is a three-dimensional partial exploded view of the locking device, movable frame and tray of the present invention.
Figure 4:
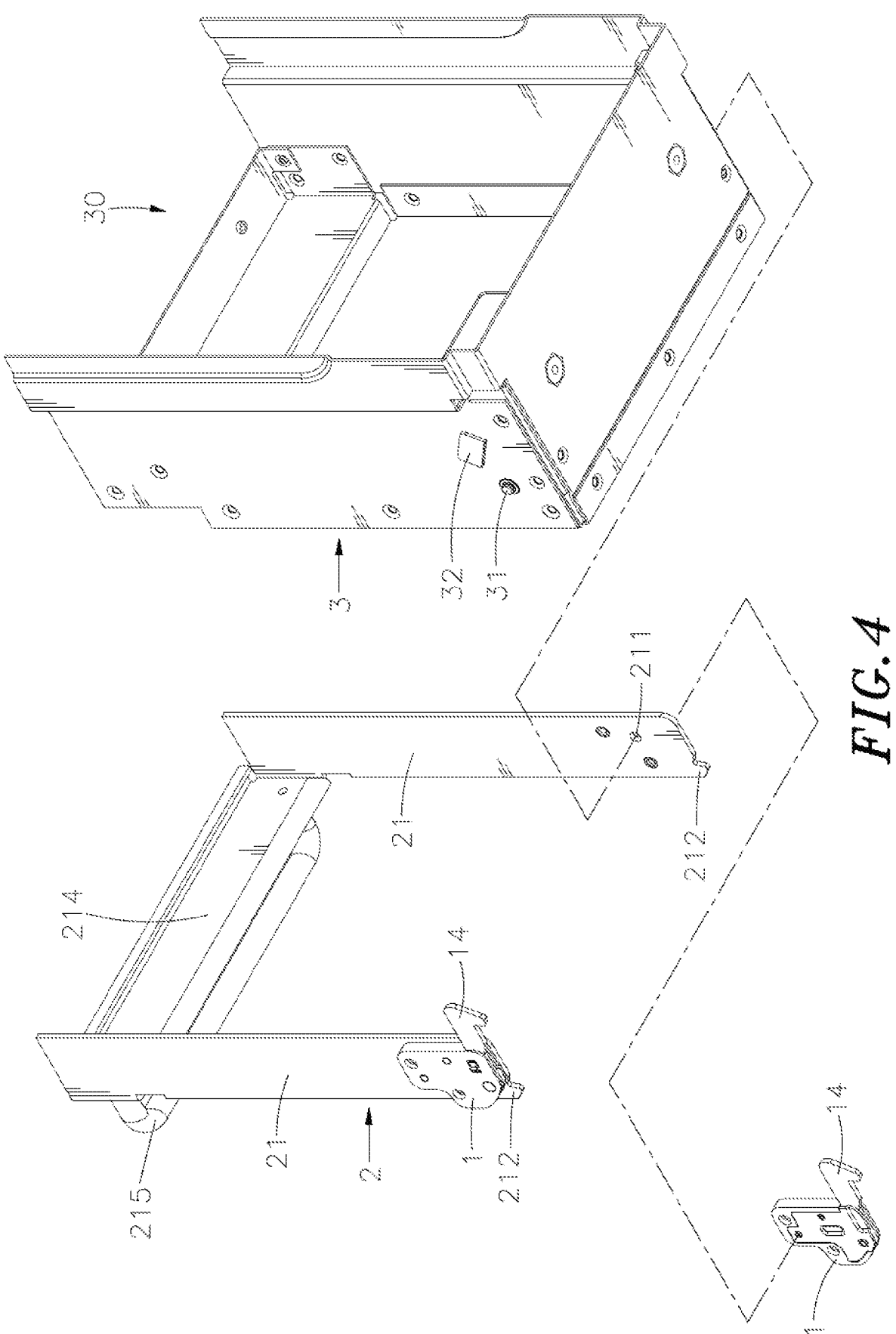
FIG. 4 is another three-dimensional partial exploded view of the locking device, movable frame and tray of the present invention.
Figure 5:
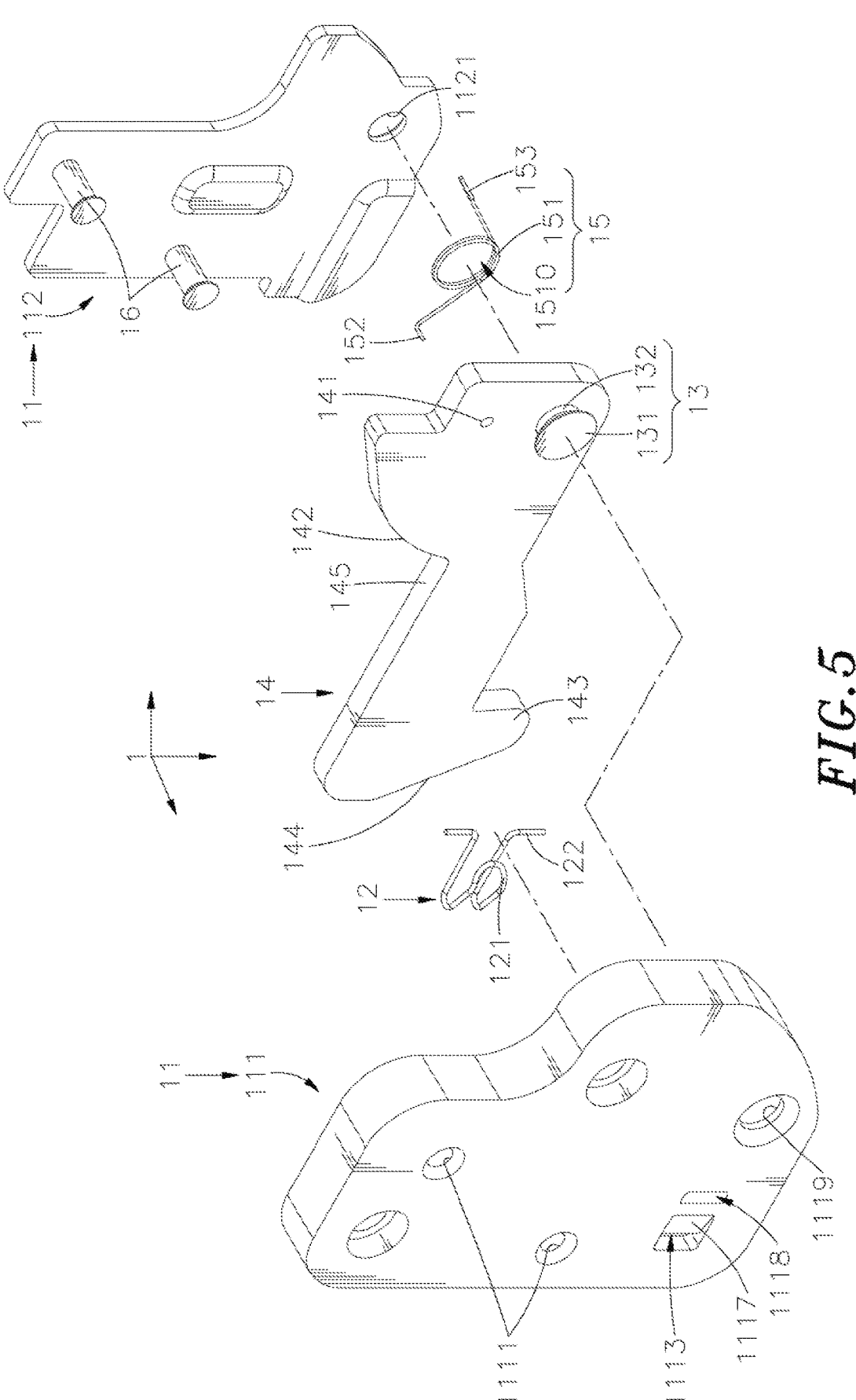
FIG. 5 is an exploded three-dimensional view of the locking device of the present invention.
Figure 6:
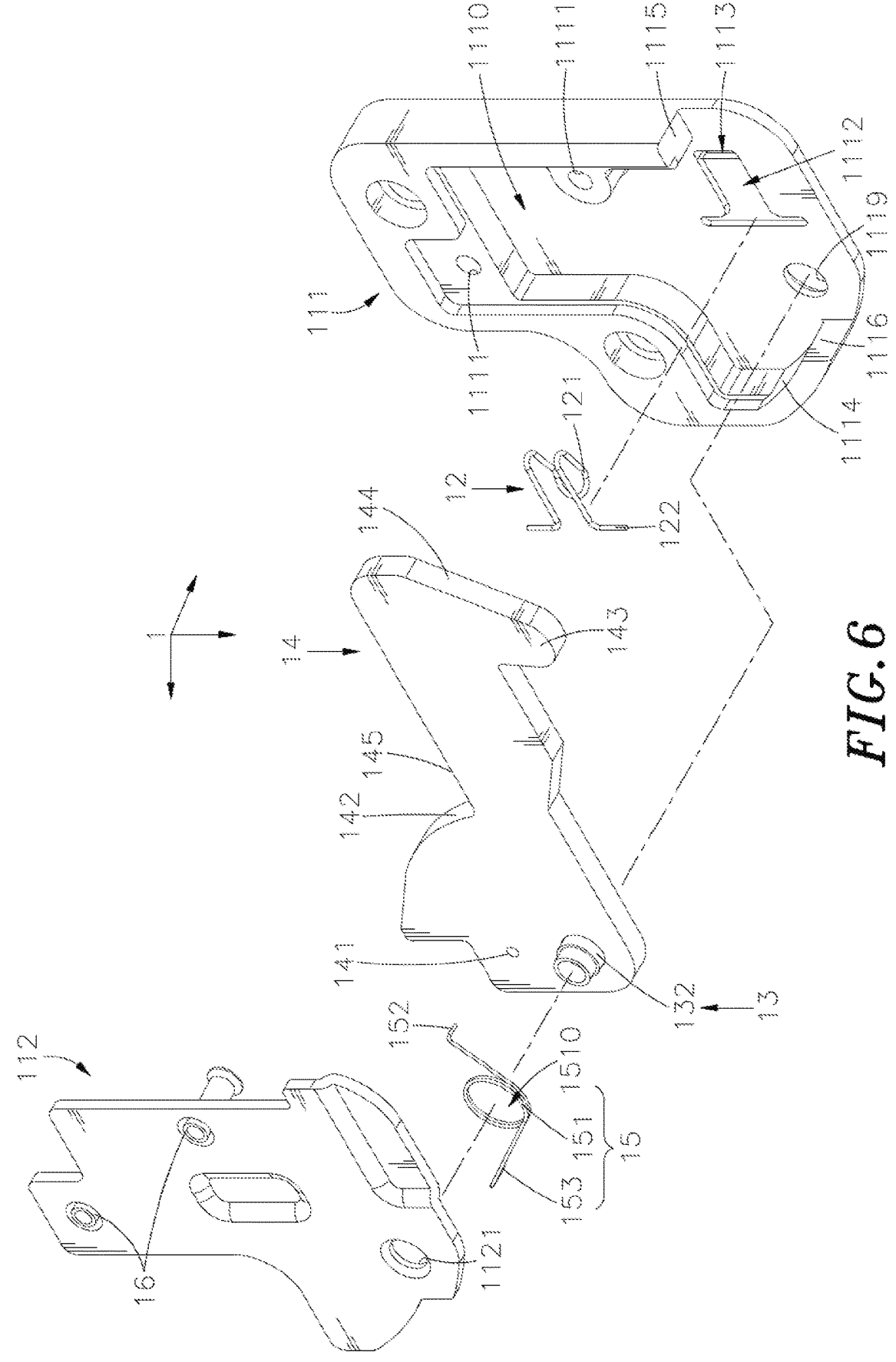
FIG. 6 is another exploded three-dimensional view of the locking device of the present invention.

In order to achieve the above objects and effects, the technical means and structures adopted by the present invention are described in detail below with respect to the preferred embodiment of the present invention, so as to facilitate a complete understanding.

Please refer to FIGS. 1 to 6, which are three-dimensional appearance view of an embodiment of the locking device of the present invention, three-dimensional partially exploded view of an embodiment of the locking device of the present invention, three-dimensional partial exploded view of the locking device, movable frame and tray of the present invention, another three-dimensional partial exploded view of the locking device, movable frame and tray of the present invention, an exploded three-dimensional view of the locking device of the present invention and another exploded three-dimensional view of the locking device of the present invention. It can be clearly seen from the figures that a tray 3 is stored in the chassis 4 of a server. The tray 3 is provided with a rotatable movable frame 2 on each of both sides. The two sides of each movable frame 2 are each provided with a locking device 1 that is locked in the chassis 4 and forms a fixed lock. The locking device 1 of the present invention mainly comprises: a casing 11, a pressing adjustment member 12, a pivot 13, a swivel hook 14 and a rotating reset member 15. All its components and features are detailed as follows:

The casing 11 comprises a cover 111 and a back plate 112 fixed by a plurality of fasteners 16 and corresponding lock holes 1111. There is a recessed storage chamber 1110 inside the cover 111, and a recessed accommodation groove 1112 is provided in the storage chamber 1110. The accommodation groove 1112 is used for the pressing adjustment member 12 for storage and fixation. The pressing adjustment member 12 has a hook portion 121, the hook portion 121 is bent and inserted through a passage 1113 provided in the accommodation groove 1112 and stopped against and positioned on the surface of the cover 111. The fasteners 16 refer to rivets or screws; and the lock holes 1111 are composed of through holes with or without internal threads.

The pivot 13 is disposed between the cover 111 and the back plate 112. The swivel hook 14 and the rotating reset member 15 are both sleeved onto the pivot 13, and the two ends of the rotating reset member 15 are respectively positioned in the swivel hook 14 and at a limit frame 1114 at the edge of the recessed storage chamber 1110. The swivel hook 14 has a hook end 143 extending out of the casing 11 and rotatably locked in the chassis 4. The hook portion 121 of the pressing adjustment member 12 adjusts the tightness of the cover 111, the swivel hook 14 and the back plate 112 according to whether it resists the inner wall of the chassis 4.

The above-mentioned cover 111 is formed with a first stopper 1115 and a second stopper 1116 on both sides of the bottom opening of the recessed storage chamber 1110 for the swivel hook 14 to rotate to a first position and a second position dead center. A slope 1117 adjacent to the passage 1113 is formed on the surface of the cover 111 where the hook portion 121 of the pressing adjustment member 12 is positioned, and a narrow positioning groove 1118 is formed adjacent to the slope 1117.

The above-mentioned pressing adjustment member 12 is composed of a torsion spring, and the two ends of the pressing adjustment member 12 form a respective fixed portion 122 that elastically resists the wall surface of the accommodation groove 1112. The two fixed portions 122 are bent and extended toward opposite inner sides to form the hook portion 121 in a hook shape.

The above-mentioned pivot 13 comprises a head 131 located in a countersunk shaft groove 1119 of the cover 111, and a shank 132 passed through the swivel hook 14 and fixed in a shaft groove 1121 of the back plate 112.

The above-mentioned rotating reset member 15 is composed of a torsion spring. The rotating reset member 15 comprises an annular portion 151 at the center that is placed around the pivot 13, a through hole 1510 defined in the annular portion 151, a fixed end 152 extending from one end of the annular portion 151 and inserted into a positioning hole 141 of the swivel hook 14, and a movable end 153 extending from an opposite end of the annular portion 151 and resisting the limit frame 1114.

The above-mentioned swivel hook 14 is composed of a plate member. The swivel hook 14 is formed with a wide plate body at the place where the pivot 13 is inserted and has a smoothly curved guide corner 142 on the top side. The hook end 143 is narrow hook-shaped and extending from one side of the smoothly curved guide corner 142 remote from the place through which the pivot 13 is inserted. An inclined guide portion 144 is formed at the front side of the hook end 143, and a resisting edge 145 is formed on the hook end 143 adjacent to the smoothly curved guide corner 142 to resist the first stopper 1115 of the cover 111.

The two sides of the above-mentioned tray 3 are each provided with an axle seat 31, and the two sides of the above-mentioned movable frame 2 are each provided with an axle hole 211 for one respective axle seat 31 to pass through, so that the movable frame 2 can rotate outside the tray 3, and the tray 3 has an accommodating space 30 for installing computer parts (not shown in the figures). On both sides of the tray 3, adjacent to the axle seats 31, there are blocking blocks 32 for forming a blocking dead center when the movable frame 2 is opened to the maximum angle. The movable frame 2 comprises two side plates 21 where the axle holes 211 are provided, two limiting protrusions 212 respectively located on the bottom sides of the two side plates 21 and locked to the chassis 4, two resisting arc grooves 213 respectively located on the bottom sides of the two side plates 21 and adjacent to the limiting protrusions 212, a connecting plate 214 horizontally connected on the top sides of the two side plates 21, and a handle 215 provided on the surface of the connecting plate 214.

The chassis 4 further comprises two positioning grooves 41 respectively located on the bottom two sides thereof for the limiting protrusions 212 of the movable frame 2 to extend into the positioning grooves 41, a blocking edge 411 located at the front end of each of the positioning grooves 41 for the resisting arc grooves 213 to contact and position respectively, two hollow positioning frames 42 respectively located on the both sides of the bottom of the chassis 4 for the hook ends 143 of the swivel hooks 14 to be fastened and positioned respectively, and a contact edge 421 respectively located at the front end of each of the positioning frames 42 for the inclined guide portions 144 of the hook ends 143 to resist when the movable frame 2 is rotated and closed.

When assembling the locking device 1 of the present invention, first insert the hook portion 121 of the pressing adjustment member 12 into the passage 1113 located in the accommodation groove 1112 of the cover 111, so that the free end of the hook portion 121 resists the positioning groove 1118, and the two fixed portions 122 are naturally accommodated in the accommodation groove 1112. After the fixed end 152 of the rotating reset member 15 is inserted into the positioning hole 141 of the swivel hook 14, the swivel hook 14 and the rotating reset member 15 are placed between the cover 111 and the back plate 112 to make the movable end 153 resist the limit frame 1114. Then insert and fix the shank 132 of the pivot 13 in the countersunk shaft groove 1119, the swivel hook 14, the through hole 1510 of the rotating reset member 15 and the shaft groove 1121. Finally, a plurality of fasteners 16 are inserted into the corresponding lock holes 1111 of the cover 111 and the back plate 112 (the lock holes of the back plate 112 are not marked) to form a fixation, and the assembly of the locking device 1 is completed by the aforementioned method.

Figure 7:
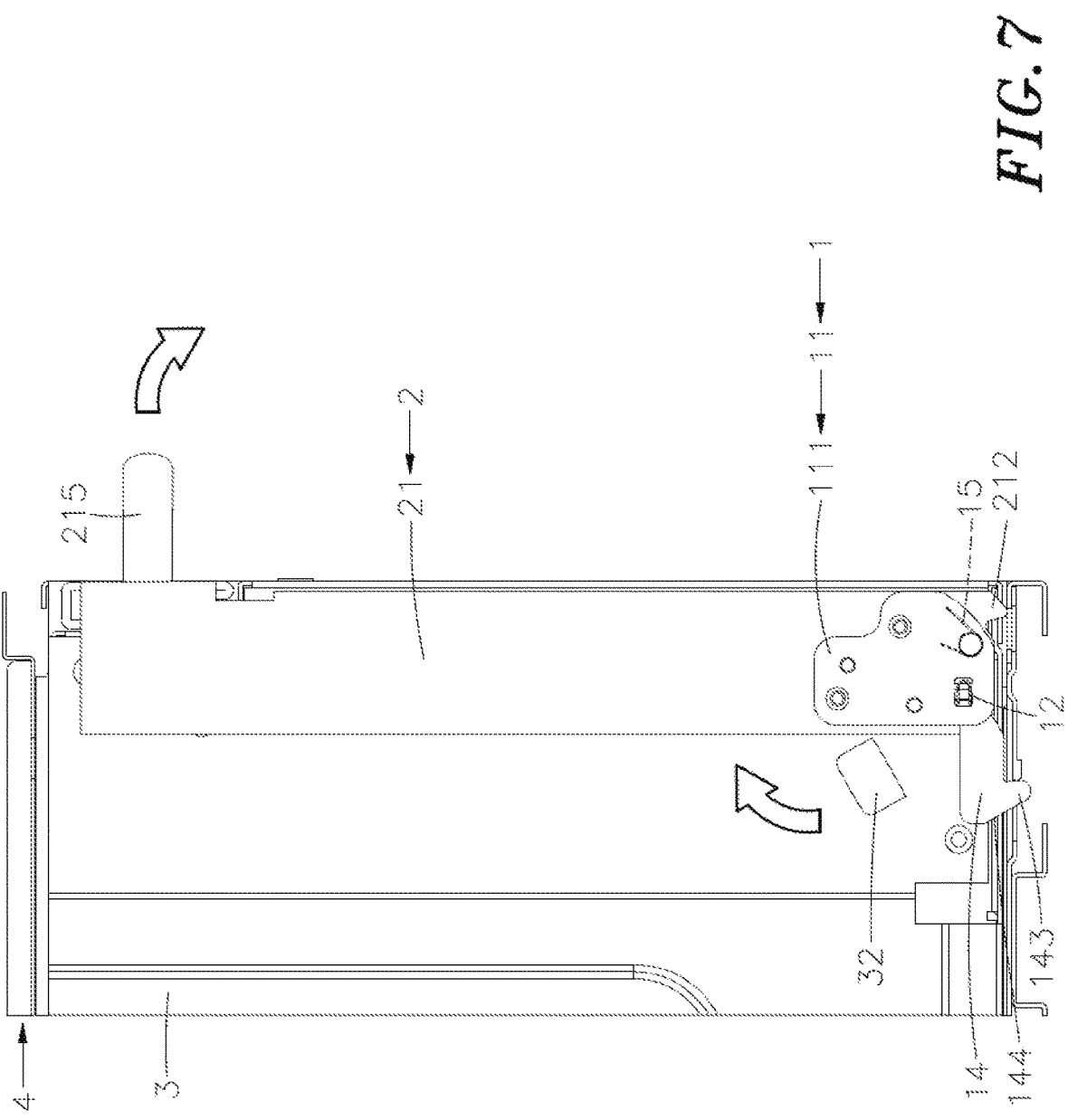
FIG. 7 is the first action diagram of the locking device installed on the movable frame of the present invention for opening.
Figure 8:
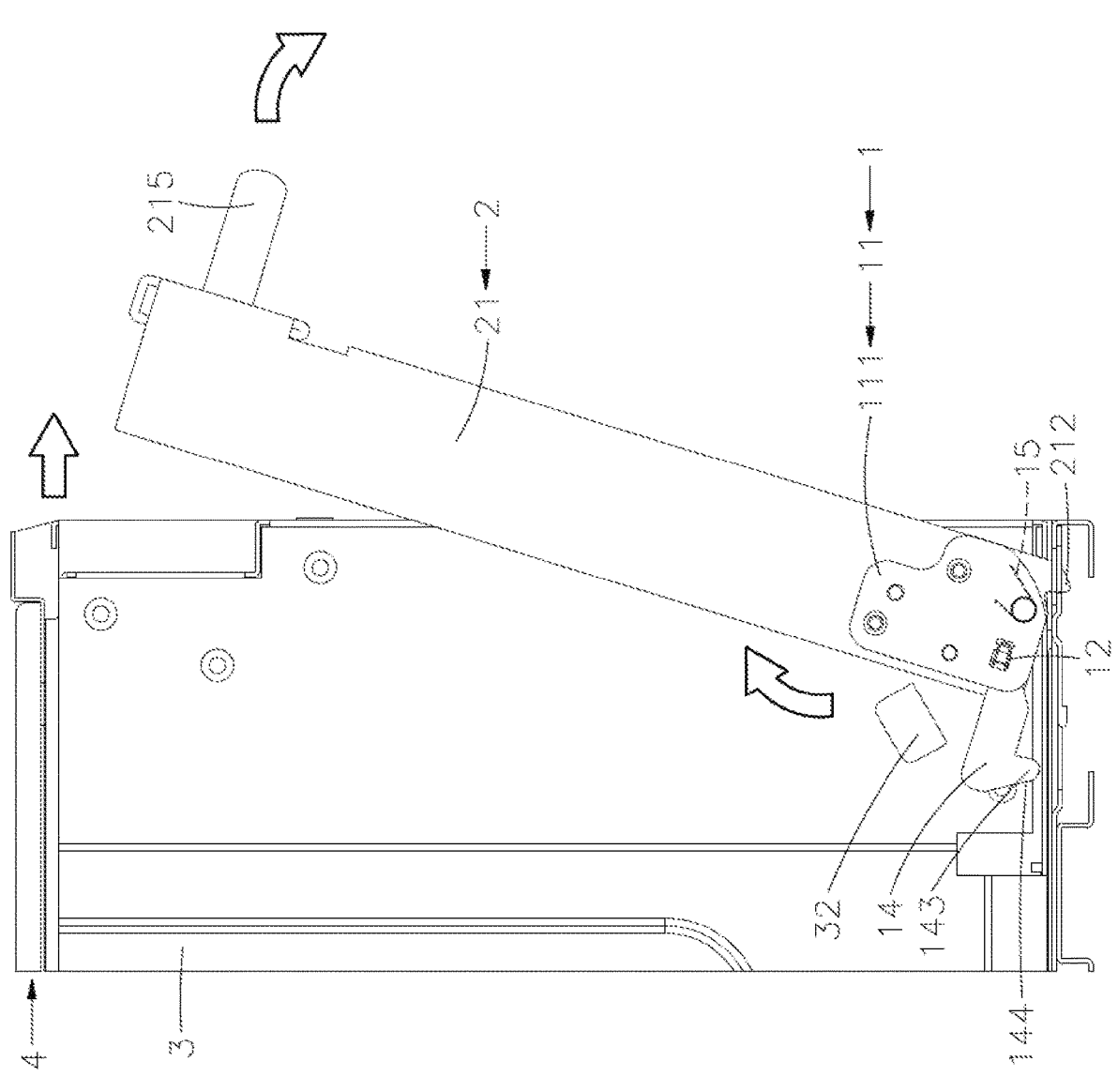
FIG. 8 is the second action diagram of the locking device installed on the movable frame of the present invention for opening.

Please refer to FIGS. 7 to 10, which are multiple action diagrams of the locking device installed on the movable frame of the present invention for opening. The two locking devices 1 are respectively locked on the two side plates 21 of the movable frame 2, and the movable frame 2 is located on both sides of the tray 3 and can rotate, and the tray 3 is stored in the chassis 4 of a server. When the movable frame 2 is stored on both sides of the tray 3, the inner wall of the chassis 4 presses against the hook portions 121 on the surface of the cover 111. Thus, the hook portion 121 of each pressing adjustment member 12 is squeezed and deformed, causing the two fixed portions 122 of the pressing adjustment member 12 to break away from the accommodation groove 1112 and press against one side of the swivel hook 14, so that both sides of the swivel hook 14 are pressed by the cover 111 and the back plate 112 tightly without rotation. The user applies force on the handle 215 of the movable frame 2 to rotate it downward. At this time, the limiting protrusions 212 of the movable frame 2 are located in the positioning grooves 41 of the chassis 4 without interfering with other mechanisms, and the hook ends 143 of the two locking devices 1 are respectively locked in the positioning frames 42 of the chassis 4, and the resisting edges 145 of the swivel hooks 14 resist the first stoppers 1115 of the respective covers 111 (as shown in FIGS. 7 and 8)

Figure 9:
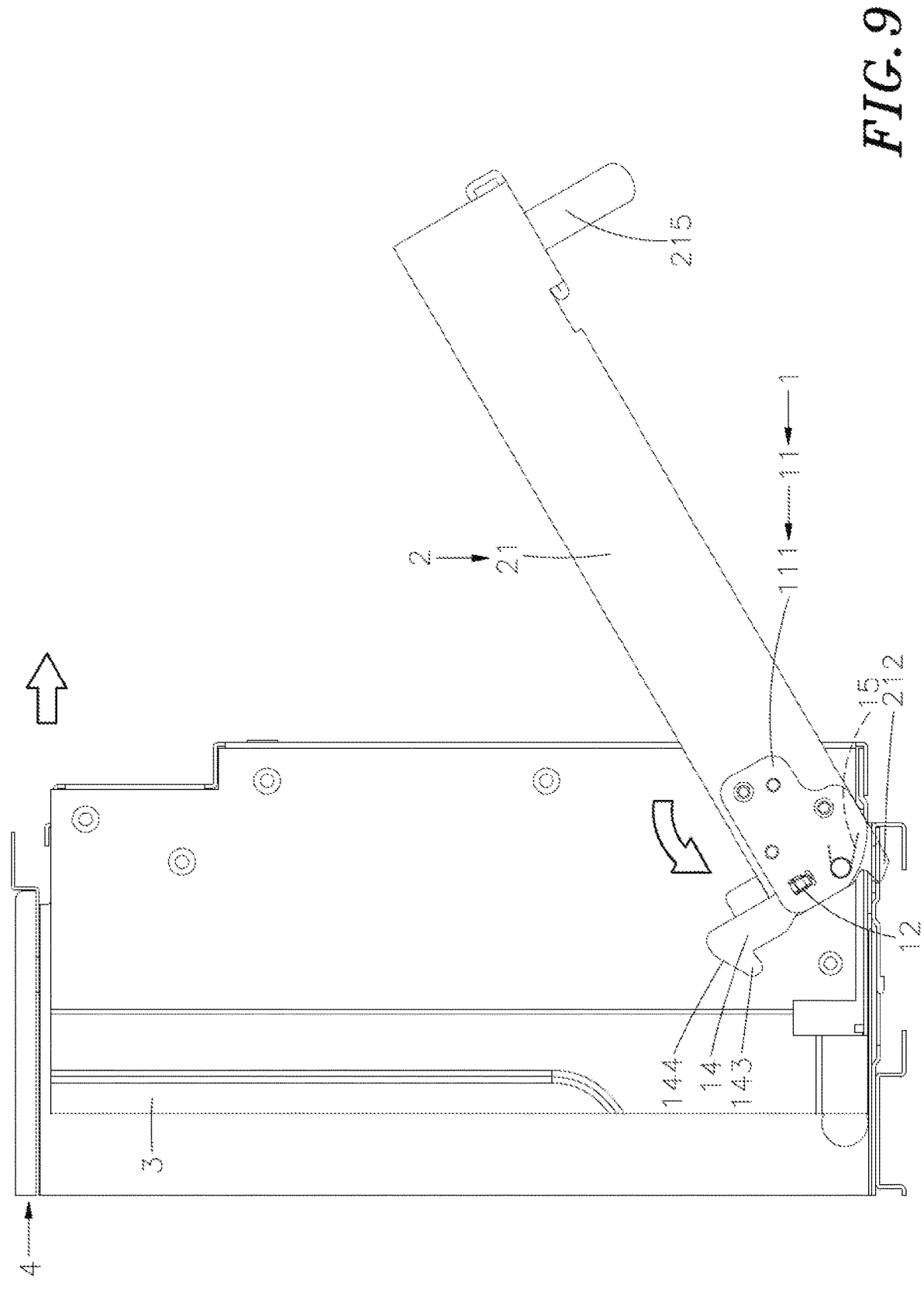
FIG. 9 is the third action diagram of the locking device installed on the movable frame of the present invention for opening.
Figure 10:
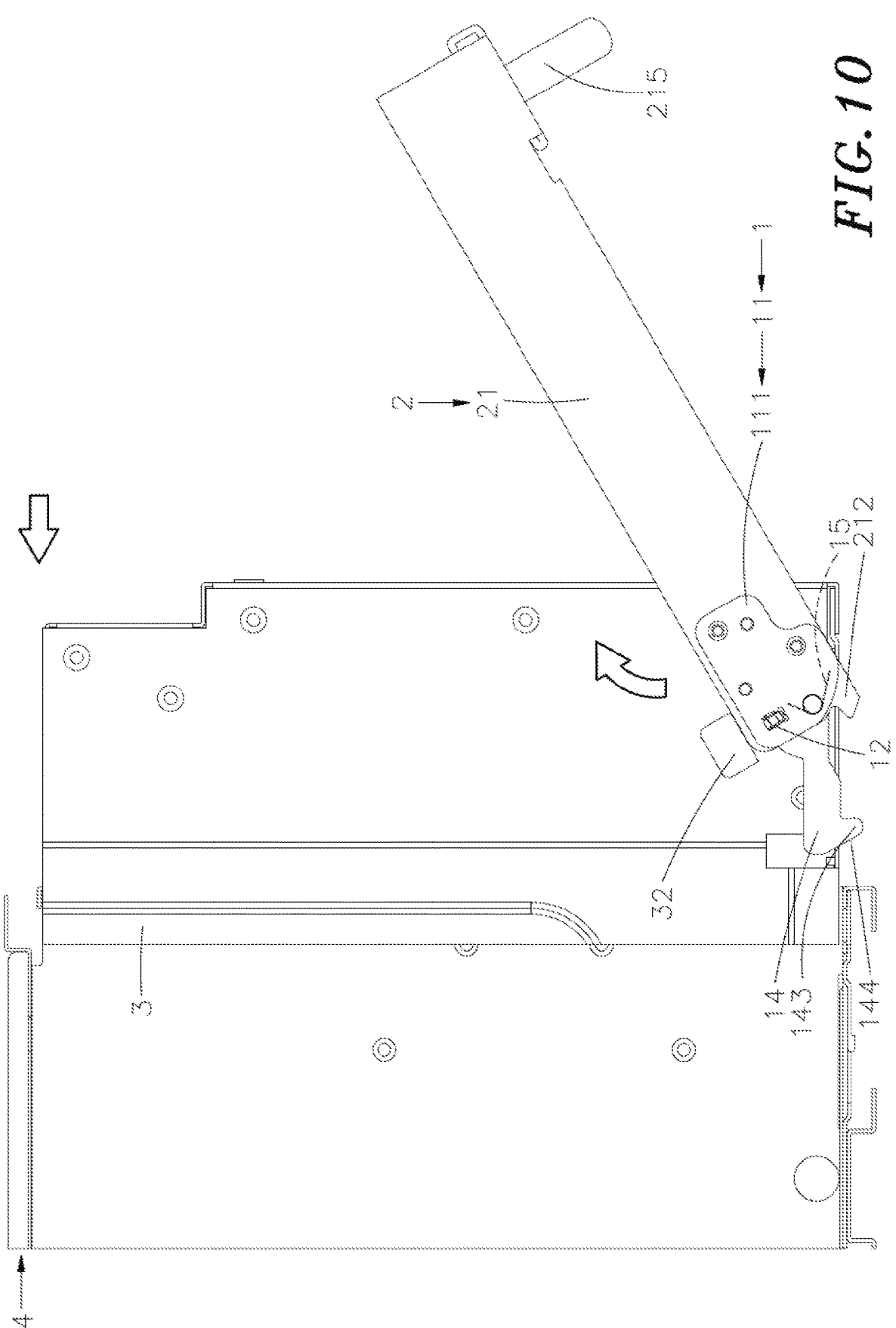
FIG. 10 is the fourth action diagram of the locking device installed on the movable frame of the present invention for opening.

When the movable frame 2 is rotated and opened from the tray 3 to a predetermined angle, after the hook portion 121 on the surface of the cover 111 is not resisted by the inner wall surface of the chassis 4, the hook portion 121 of the pressing adjustment member 12 generates elastic reset and the two fixed portions 122 are re-accommodated in accommodation groove 1112, and the two sides of the swivel hook 14 form an unfastened state with the cover 111 and the back plate 112 to cause rotation, so that the hook end 143 of the swivel hook 14 rotates downward (during the downward rotation of the movable frame 2, the smoothly curved guide corner 142 of the swivel hook 14 contacts the first stopper 1115 of the cover 111 to produce a damping rotation) and is locked and positioned in the respective positioning frame 42 at the bottom of chassis 4 to form a fixed state. And when the movable frame 2 is opened to the maximum angle, at this time, the side plates 21 of the movable frame 2 are in contact with the blocking blocks 32 of the tray 3 to form an interference stop, and the front-end resisting arc grooves 213 of the limiting protrusions 212 on the bottom side of the side plates 21 are in contact with the front-end blocking edges 411 of the positioning grooves 41 of the chassis 4 to form an interference block. You can drag the tray 3 to move horizontally a predetermined distance outwards and expose the top side of the accommodating space 30 (as shown in FIGS. 9 and 10), that is to repair or replace the computer parts installed inside the tray 3. After completion, you can push the movable frame 2 back to the two sides of the tray 3.

Figure 11:
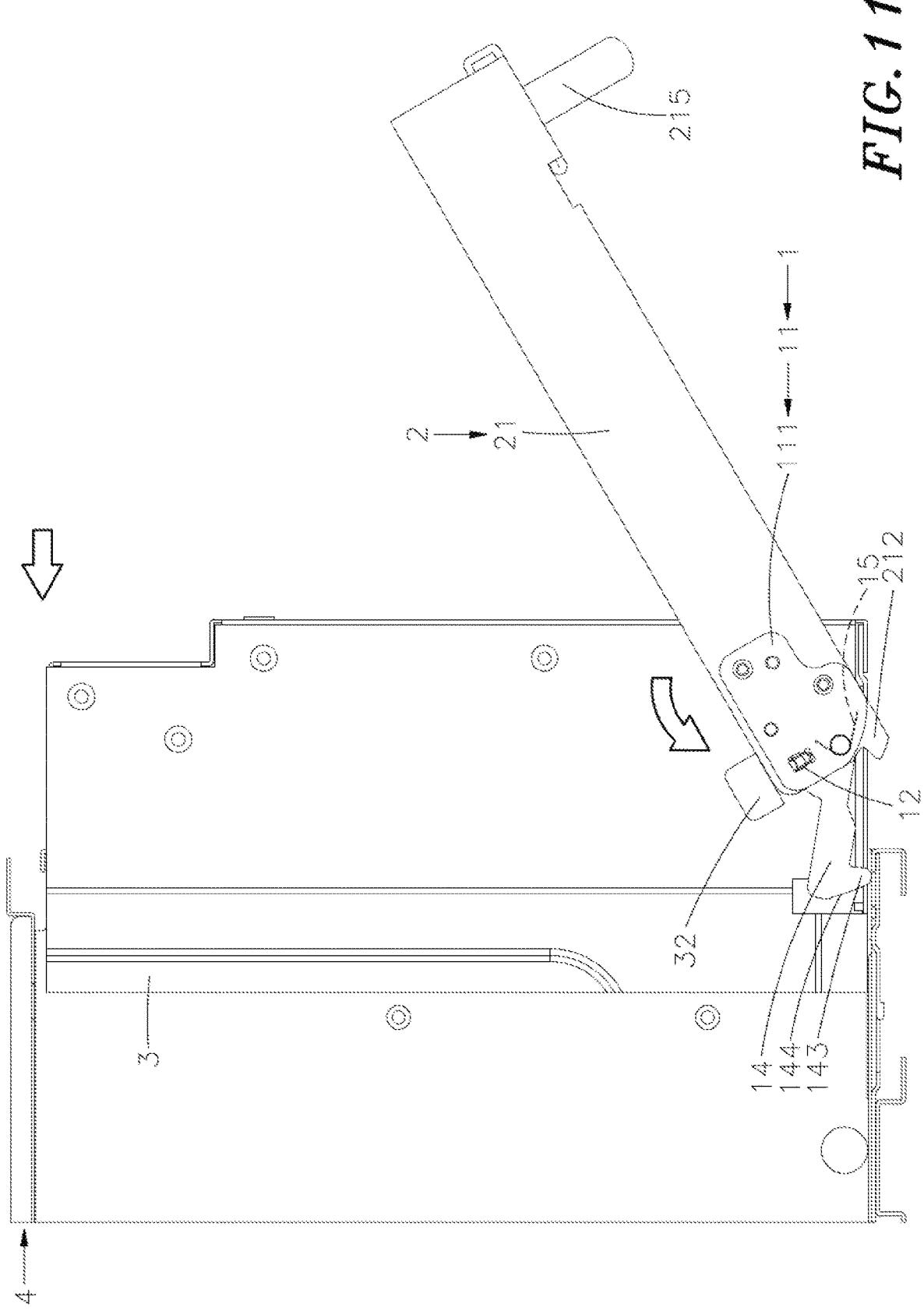
FIG. 11 is the first action diagram of the locking device installed on the movable frame of the present invention for closing.
Figure 12:
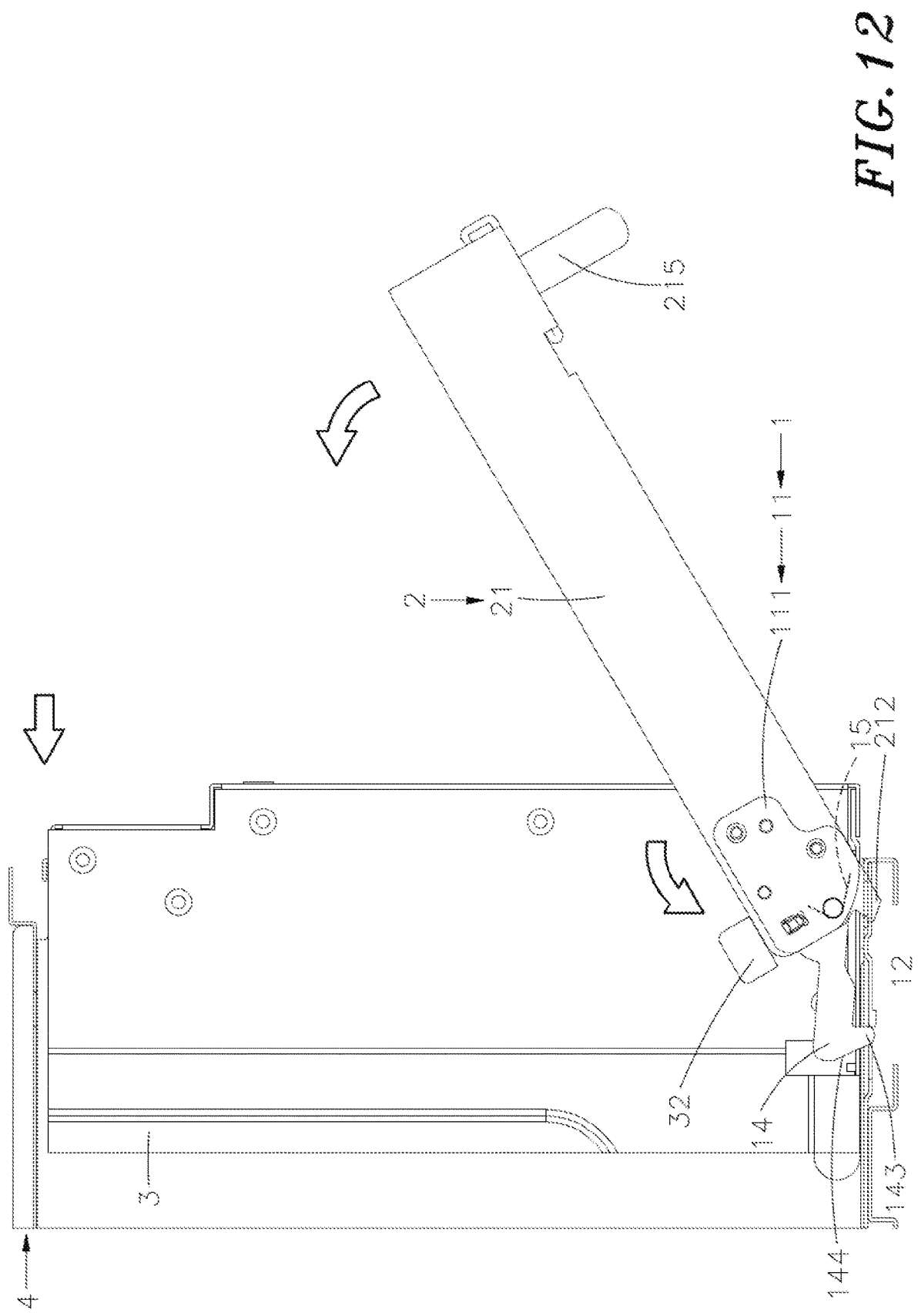
FIG. 12 is the second action diagram of the locking device installed on the movable frame of the present invention for closing.

Please refer to FIGS. 11 and 12, which are plurality of action diagrams of the locking device installed on the movable frame of the present invention for closing. When wanting to push the movable frame 2 back to the two sides of the tray 3, the user exerts force on the handle 215 on the movable frame 2 to rotate it upward. At this time, after the inclined guide portion 144 of the front edge of the swivel hook 14 comes into contact with the contact edge 421 of the respective positioning frame 42 of the chassis 4, the swivel hook 14 generates an upward sliding force and temporarily breaks away from the respective positioning frame 42 of the chassis 4 to form a damping rotation. At the same time, the side plates 21 of the movable frame 2 rotate in a direction away from the blocking blocks 32 and escape interference, and the limiting protrusions 212 on the bottom side of the side plates 21 are also away from the blocking edges 411 of the front ends of the positioning grooves 41 and out of interference (as shown in FIG. 11). During the upward rotation of the movable frame 2, the smoothly curved guide corner 142 of the swivel hook 14 contacts the first stopper 1115 of the cover 111 to generate a damping rotation, causing the resisting edge 145 of the swivel hook 14 to resist the first stopper 1115 of the cover 111. This allows the swivel hook 14 to be positioned in the casing 11 without causing rotation and the hook end 143 to buckle back into the respective positioning frame 42 of the chassis 4 to form a position. At the same time, the movable frame 2 is pushed back the two sides of the tray 3 again, causing the inner wall of the chassis 4 to press against the hook portion 121 on the surface of the cover 111, so that the both sides of the swivel hook 14 are pressed tightly by the cover 111 and the back plate 112 without causing rotation (as shown in FIG. 12). Through the above, a mechanism with quick disassembly and assembly is formed.

Another advantage of the present invention is that the axle seats 31 of the tray 3 and the pivot 13 of the locking device 1 are not rotated on the same axis. This has the advantage of saving the space required for the rotation mechanism and increasing the distance between the force application point and the pivot 13 of the locking device 1 to form a larger leverage ratio so that force can be applied easily.

What is claimed is:

1. A locking structure comprising: a tray mounted in a preset chassis of a preset server, a preset movable frame rotatably coupled to two sides of said tray, and two locking devices respectively provided on two sides of said preset movable frame and locked in said preset chassis to form a fixation, said locking devices each comprising:

a casing comprising a cover and a back plate fixed by a plurality of fasteners and corresponding lock holes on said cover, said cover comprising a recessed storage chamber, a limit frame located at an edge of said storage chamber, a recessed accommodation groove provided in said storage chamber and a passage provided in said accommodation groove;

a pressing adjustment member set in said accommodation groove, said pressing adjustment member comprising a hook portion, said hook portion is bent and inserted through said passage and stopped against and positioned on a surface of said cover;

a pivot disposed between said cover and said back plate; and a swivel hook and a rotating reset member both sleeved onto said pivot, said rotating reset member having two ends thereof respectively positioned in said swivel hook and said limit frame, said swivel hook comprising a hook end extending out of said casing and rotatably locked in said preset chassis, said hook portion of said pressing adjustment member adjusting the tightness of said cover, said swivel hook and said back plate according to whether said hook portion of said pressing adjustment member resists an inner wall of said preset chassis.

2. The locking structure as claimed in claim 1, wherein said cover further comprises a first stopper and a second stopper formed on two sides of a bottom opening of said storage chamber for said swivel hook to rotate to a first position and a second position dead center.

3. The locking structure as claimed in claim 1, wherein said cover further comprises a slope located adjacent to said passage where said hook portion of said pressing adjustment member is positioned, and a narrow positioning groove located adjacent to said slope.

4. The locking structure as claimed in claim 1, wherein said pressing adjustment member is composed of a torsion spring, said pressing adjustment member comprising two fixed portions respectively formed on two ends thereof and elastically resisting a wall surface of said accommodation groove, said two fixed portions being bent and extended toward opposite inner sides to form said hook portion in a hook shape.

5. The locking structure as claimed in claim 1, wherein said pivot comprises a head located in a countersunk shaft groove of said cover, and a shank passed through said swivel hook and fixed in a shaft groove on said back plate.

6. The locking structure as claimed in claim 1, wherein said rotating reset member is composed of a torsion spring, said rotating reset member comprising an annular portion at a center that is placed around said pivot, a through hole defined in said annular portion, a fixed end extending from one end of said annular portion and inserted into a positioning hole on said swivel hook, and a movable end extending from an opposite end of said annular portion and resisting said limit frame.

7. The locking structure as claimed in claim 1, wherein said swivel hook is composed of a plate member, said swivel hook comprises a wide plate body formed at a place where said pivot is inserted, a smoothly curved guide corner located on a top side of said wide plate body, said hook end, which is narrow hook-shaped and extending from one side of said smoothly curved guide corner remote from the place through which said pivot is inserted, an inclined guide portion formed at a front side of said hook end, and a resisting edge formed on said hook end adjacent to said smoothly curved guide corner to resist said first stopper of said cover.

8. The locking structure as claimed in claim 1, wherein said preset tray comprises two axle seats respectively located at two sides thereof, an accommodating space for installing computer parts, and two blocking blocks respectively located adjacent to said axle seats for forming a blocking dead center when said preset movable frame is opened to the maximum angle; said preset movable frame comprises two axle holes for said axle seats to pass through, so that said preset movable frame is rotatable outside said tray, two side plates where said axle holes are provided respectively, two limiting protrusions respectively located on respective bottom sides of said two side plates and locked to said preset chassis, two resisting arc grooves respectively located adjacent to said limiting protrusions, a connecting plate horizontally connected on respective top sides of said two side plate, and a handle provided on a surface of said connecting plate.

9. The locking structure as claimed in claim 8, wherein said preset chassis further comprises two positioning grooves respectively located on bottom two sides thereof for said limiting protrusions of said preset movable frame to extend into said positioning grooves, a blocking edge located at a front end of each of said positioning grooves for said resisting arc grooves to contact and position respectively, two hollow positioning frames respectively located on bottom two sides of said preset chassis for hook ends of swivel hooks to be fastened and positioned respectively, and a contact edge respectively located at a front end of each of said positioning frames for a inclined guide portion of said hook end of one respective said swivel hook to resist when said preset movable frame is rotated and closed.

10. A locking device, comprising:
  a casing comprising a cover and a back plate fixed by a plurality of fasteners and corresponding lock holes on said cover, said cover comprising an accommodation groove and a passage provided in said accommodation groove;
  a pressing adjustment member set in said casing, said pressing adjustment member comprising a hook portion, said hook portion is bent and inserted through said passage and stopped against and positioned on a surface of said cover;
  a pivot disposed between said cover and said back plate; and a swivel hook and a rotating reset member both sleeved onto said pivot, said swivel hook comprising a hook end extending out of said casing, said hook portion of said pressing adjustment member being resisted by an external default mechanism to adjust tightness of said cover, said swivel hook and said back plate;
  wherein said pressing adjustment member is composed of a torsion spring, said pressing adjustment member comprising two fixed portions respectively formed on two ends thereof and elastically resisting a wall surface of said accommodation groove, said two fixed portions being bent and extended toward opposite inner sides to form said hook portion in a hook shape.

11. The locking device as claimed in claim 10, wherein said casing further comprises a recessed storage chamber, and said accommodation groove is recessed in said storage chamber and used for storage and fixation of said pressing adjustment member.

12. The locking device as claimed in claim 10, wherein said cover further comprises a storage chamber, and a limit frame located at an edge of said storage chamber; said rotating reset member has two ends thereof respectively positioned in said swivel hook and said limit frame at the edge of said storage chamber.

13. The locking device as claimed in claim 10, wherein said cover further comprises a first stopper and a second stopper formed on two sides of a bottom opening of said a storage chamber thereof for said swivel hook to rotate to a first position and a second position dead center.

14. The locking device as claimed in claim 10, wherein said cover further comprises a slope located adjacent to said passage where said hook portion of said pressing adjustment member is positioned, and a narrow positioning groove located adjacent to said slope.

15. A locking device, comprising:
  a casing comprising a cover and a back plate, said cover comprising a recessed storage chamber and a recessed accommodation groove;
  a pivot disposed between said cover and said back plate; and
  a swivel hook and a rotating reset member both sleeved onto said pivot, said swivel hook comprising a hook end locked into a preset chassis;
  wherein two said locking devices are locked on two side plates of a preset movable frame, which has two opposite axle holes respectively and pivotally connected to respective axle seats on both sides of a preset tray, and said axle seats of said preset tray and said pivots of said two locking devices are on different axes.

16. The locking device as claimed in claim 15, further comprising a pressing adjustment member accommodated and fixed in said accommodation groove.

17. The locking device as claimed in claim 16, wherein said pressing adjustment member is composed of a torsion spring, said pressing adjustment member comprising two fixed portions respectively formed on two ends thereof and elastically resisting a wall surface of said accommodation groove, said two fixed portions being bent and extended toward opposite inner sides to form a hook portion in a hook shape.

18. The locking device as claimed in claim 15, wherein said preset tray comprises said two axle seats respectively located at two sides thereof, an accommodating space for installing computer parts, and two blocking blocks respectively located adjacent to said axle seats for forming a blocking dead center when said preset movable frame is opened to the maximum angle; said preset movable frame further comprises said two axle holes for said axle seats to pass through, so that said preset movable frame is rotatable outside said preset tray, said two side plates where said axle holes are provided respectively, two limiting protrusions respectively located on respective bottom sides of said two side plates and locked to said preset chassis, two resisting arc grooves respectively located adjacent to said limiting protrusions, a connecting plate horizontally connected on respective top sides of said two side plate, and a handle provided on a surface of said connecting plate.

19. The locking device as claimed in claim 18, wherein said preset chassis further comprises two positioning grooves respectively located on bottom two sides thereof for said limiting protrusions of said preset movable frame to extend into said positioning grooves, a blocking edge located at a front end of each of said positioning grooves for said resisting arc grooves to contact and position respectively, two hollow positioning frames respectively located on bottom two sides of said preset chassis for the said hook ends of said swivel hooks to be fastened and positioned respectively, and a contact edge respectively located at a front end of each of said positioning frames for inclined guide portions of said hook ends to resist when said preset movable frame is rotated and closed.

* * * * *